United States Patent
Yang et al.

(10) Patent No.: US 10,205,900 B2
(45) Date of Patent: Feb. 12, 2019

(54) PIXEL CIRCUIT, SEMICONDUCTOR CAMERA DETECTION CIRCUIT AND DISPLAY DEVICE

(71) Applicant: BOE TECHNOLOGY GROUP CO., LTD., Beijing (CN)

(72) Inventors: Shengji Yang, Beijing (CN); Xue Dong, Beijing (CN); Hailin Xue, Beijing (CN); Xiaochuan Chen, Beijing (CN); Haisheng Wang, Beijing (CN); Lei Wang, Beijing (CN); Yingming Liu, Beijing (CN); Xiaoliang Ding, Beijing (CN); Ming Yang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/568,996

(22) PCT Filed: Apr. 28, 2017

(86) PCT No.: PCT/CN2017/082327
§ 371 (c)(1),
(2) Date: Oct. 24, 2017

(87) PCT Pub. No.: WO2018/000927
PCT Pub. Date: Jan. 4, 2018

(65) Prior Publication Data
US 2018/0270430 A1    Sep. 20, 2018

(30) Foreign Application Priority Data

Jun. 30, 2016 (CN) .......................... 2016 1 0506759

(51) Int. Cl.
*H04N 5/365* (2011.01)
*H04N 5/3745* (2011.01)
(Continued)

(52) U.S. Cl.
CPC ............... *H04N 5/365* (2013.01); *G09G 3/22* (2013.01); *H01L 27/14643* (2013.01);
(Continued)

(58) Field of Classification Search
CPC .... H04N 5/357–5/3675; H04N 5/3698; H04N 5/3745–5/37457; H04N 5/378; H01L 27/14643; G09G 3/22
See application file for complete search history.

(56) References Cited

U.S. PATENT DOCUMENTS 9,530,354 B2 * 12/2016 Tan .......................... G06F 3/042
9,535,531 B2 *  1/2017 Tan .......................... G06F 3/042
(Continued)

FOREIGN PATENT DOCUMENTS

CN       102956191 A      3/2013
CN       103152531 A      6/2013
(Continued)

OTHER PUBLICATIONS

Search Report and Written Opinion dated Jul. 31, 2017 from State Intellectual Property Office of the P.R. China.

*Primary Examiner* — Lin Ye
*Assistant Examiner* — Chriss S Yoder, III
(74) *Attorney, Agent, or Firm* — Dilworth & Barrese, LLP; Michael J. Musella, Esq.

(57) ABSTRACT

A pixel circuit, a semiconductor camera detection circuit and a display device. The pixel circuit includes: a photodiode, a driving circuit, an initialization circuit, a transmission circuit, a voltage write-in circuit (2 and a compensation circuit. One end of the photodiode is electrically connected to a grounding end, and another end is electrically connected to the transmission circuit; the initialization circuit is configured to pull a voltage of a first node to an initialization voltage under control of the initialization signal end; the (Continued)

transmission circuit is configured to pull down the voltage of the first node from the initialization voltage to a data voltage under control of the first scanning signal end; the voltage write-in circuit is configured to write the data voltage into the driving circuit and output a grounding voltage to the compensation circuit; the compensation circuit is configured to perform threshold voltage compensation on the driving circuit.

17 Claims, 5 Drawing Sheets

(51) Int. Cl.
   *H04N 5/367* (2011.01)
   *G09G 3/22* (2006.01)
   *H04N 5/369* (2011.01)
   *H01L 27/146* (2006.01)
   *H04N 5/378* (2011.01)

(52) U.S. Cl.
   CPC ........... *H04N 5/367* (2013.01); *H04N 5/3698* (2013.01); *H04N 5/378* (2013.01); *H04N 5/3745* (2013.01)

(56) References Cited

U.S. PATENT DOCUMENTS

2005/0110884 A1* 5/2005 Altice, Jr. ......... H01L 27/14603
                                                          348/302
2015/0350584 A1   12/2015 Fenigstein et al.

FOREIGN PATENT DOCUMENTS

CN    204104026 U    1/2015
CN    105913792 A    8/2016

* cited by examiner

PIXEL CIRCUIT, SEMICONDUCTOR CAMERA DETECTION CIRCUIT AND DISPLAY DEVICE

TECHNICAL FIELD

The present disclosure relates to a pixel circuit, a semiconductor camera detection circuit and a display device.

BACKGROUND

A Complementary Metal-Oxide Semiconductor (CMOS) technology and a technique thereof are widely applied to the field of computers. An Active Pixel Sensor (APS) serves as the most common CMOS camera detection circuit, and a specific circuit of such an APS pixel circuit is as shown in FIG. 1.

As shown in FIG. 1, the APS pixel circuit is formed by a switching transistor T1, a switching transistor T3, a driving transistor T2 and a photodiode PD, and the driving transistor T2 serves as a source electrode follower. When exposure begins, the switching transistor T1 is turned on under control of an initialization signal (Reset) input by an initialization signal end, the photodiode PD is reversely biased to a voltage Trst, and the voltage Trst charges a PN junction capacitor of the photodiode PD. When incident light illuminates on a PN junction of the photodiode PD, light quantum excitation generates electron-hole pairs on the PN junction, such that charges on the PN junction capacitor are recombined, causing a gate electrode potential of the driving transistor T2 to be reduced. Finally, the switching transistor T3 is turned on, a size of a photocurrent at this point is determined from an output signal line 10, and current illumination in front of a camera is ultimately determined according to the size of the actually measured photocurrent.

From FIG. 1, it can be seen that in existing technologies, a current read by the output signal line 10 is related to a threshold voltage of the driving transistor T2, while in an actual manufacturing process, due to technological manufacture procedures and long time operation of the driving transistor T2, drift of a threshold voltage Vth of the driving transistor T2 may be caused. As a result, there exists a difference between the size of a current finally output and the size of a current actually generated after illumination on the photodiode PD, and distortion of a display image is thus generated.

In conclusion, in existing technologies, due to the drift of the threshold voltage of the driving transistor, there exists a difference between the size of the output current and the size of the current actually generated by illumination.

SUMMARY

Embodiments of the disclosure provide a pixel circuit, comprising: a photodiode, a driving circuit, an initialization circuit, a transmission circuit, a voltage write-in circuit and a compensation circuit;

one end of the photodiode is electrically connected to a grounding end, and another end of the photodiode is electrically connected to the transmission circuit;

the initialization circuit is electrically connected to an initialization signal end and an initialization voltage end, and configured to pull a voltage of a first node to an initialization voltage input by the initialization voltage end under control of the initialization signal end;

the transmission circuit is electrically connected to the initialization circuit and a first scanning signal end, and configured to pull down the voltage of the first node from the initialization voltage to a data voltage under control of the first scanning signal end, wherein a value of the data voltage is decreased along with an increase of an illumination intensity received by the photodiode;

the voltage write-in circuit is electrically connected to the first node, the driving circuit, the compensation circuit, the grounding end and a second scanning signal end, and configured to write the data voltage into the driving circuit under control of the second scanning signal end and output a grounding voltage to the compensation circuit;

the compensation circuit is electrically connected to the driving circuit, a high voltage-level signal end, a compensation signal end and the second scanning signal end, and configured to perform threshold voltage compensation on the driving circuit under control of the compensation signal end and the second scanning signal end; and the first node is an intersection point among the initialization circuit, the transmission circuit and the voltage write-in circuit.

For example, the compensation circuit includes a first capacitor, a first switching transistor, a second switching transistor and an inverter;

one end of the first capacitor is electrically connected to the voltage write-in circuit, and another end of the first capacitor is electrically connected to the driving circuit;

a gate electrode of the first switching transistor is electrically connected to the compensation signal end, and two other electrodes of the first switching transistor are electrically connected to the high voltage-level signal end and the driving circuit, respectively;

one end of the inverter is electrically connected to the second scanning signal end, and another end of the inverter is electrically connected to a gate electrode of the second switching transistor; and two other electrodes of the second switching transistor are electrically connected to the voltage write-in circuit and the driving circuit, respectively.

For example, the initialization circuit includes a third switching transistor and a second capacitor;

one end of the second capacitor is electrically connected to the first node, and another end of the second capacitor is electrically connected to the grounding end; and a gate electrode of the third switching transistor is electrically connected to the initialization signal end, and two other electrodes of the third switching transistor are electrically connected to the initialization voltage end and the first node, respectively.

For example, the transmission circuit includes a fourth switching transistor, a gate electrode of the fourth switching transistor is electrically connected to the first scanning signal end and two other electrodes of the fourth switching transistor are electrically connected to the photodiode and the first node, respectively.

For example, the voltage write-in circuit includes a fifth switching transistor, a sixth switching transistor and a seventh switching transistor;

a gate electrode of the fifth switching transistor is electrically connected to the second scanning signal end and two other electrodes of the fifth switching transistor are electrically connected to the grounding end and the compensation circuit, respectively;

a gate electrode of the sixth switching transistor is electrically connected to the second scanning signal end and two other electrodes of the sixth switching transistor are electrically connected to the first node and the driving circuit, respectively; and a gate electrode of the seventh switching transistor is electrically connected to the second scanning signal end and two other electrodes of the seventh switching transistor are electrically connected to the grounding end and the driving circuit, respectively.

For example, the first switching transistor, the second switching transistor, the third switching transistor, the fourth switching transistor, the fifth switching transistor, the sixth switching transistor and the seventh switching transistor are all P type thin film transistors.

For example, the driving circuit includes a driving transistor, a gate electrode of the driving transistor is electrically connected to the compensation circuit and the voltage write-in circuit, a source electrode of the driving transistor is electrically connected to the compensation circuit and a drain electrode of the driving transistor is electrically connected to the voltage write-in circuit and an output signal line.

For example, the driving transistor is a P type thin film transistor.

Embodiments of the disclosure provide a semiconductor camera detection circuit, comprising the pixel circuit described above.

Embodiments of the disclosure provide a display device, comprising the semiconductor camera detection circuit described above.

BRIEF DESCRIPTION OF THE DRAWINGS

In order to illustrate the technical solutions in the embodiments of the present disclosure or the existing arts more clearly, the drawings needed to be used in the description of the embodiments or the existing arts will be briefly described in the following; it is obvious that the drawings described below are only related to some embodiments of the present disclosure, for one ordinary skilled person in the art, other drawings can be obtained according to these drawings without making other inventive work.

DETAILED DESCRIPTION

Embodiments of the present disclosure provide a pixel circuit, a semiconductor camera detection circuit and a display device, which are used for solving the problem that there exists a difference between the size of an output current and the size of a current actually generated by illumination due to the drift of the threshold voltage of a driving transistor.

Hereafter, in order to illustrate the purposes, technical solutions and advantages in the embodiments of the present disclosure more clearly, the technical solutions of the embodiments of the present disclosure will be described in a clearly and fully understandable way in connection with the drawings related to the embodiments of the disclosure. It is obvious that the described embodiments are just a part but not all of the embodiments of the present disclosure. Based on embodiments of the present disclosure, all other embodiments obtained by those skilled in the art without making other inventive work should be within the scope of the present disclosure.

The pixel circuit provided by embodiments of the present disclosure is introduced in detail in combination with accompanying drawings.

Figure 1:
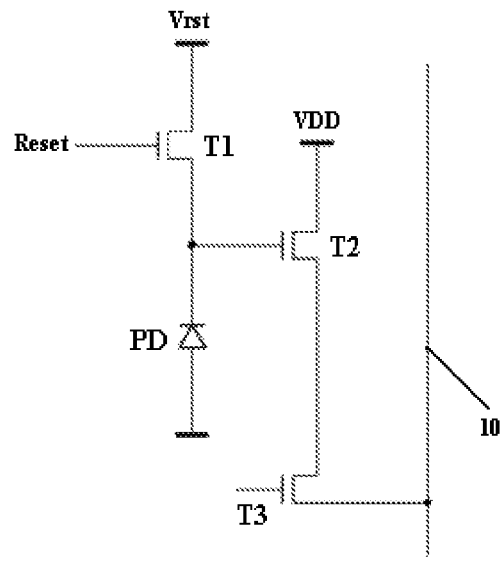
FIG. 1 is a circuit structural schematic diagram of a pixel circuit in existing technologies.
Figure 2:
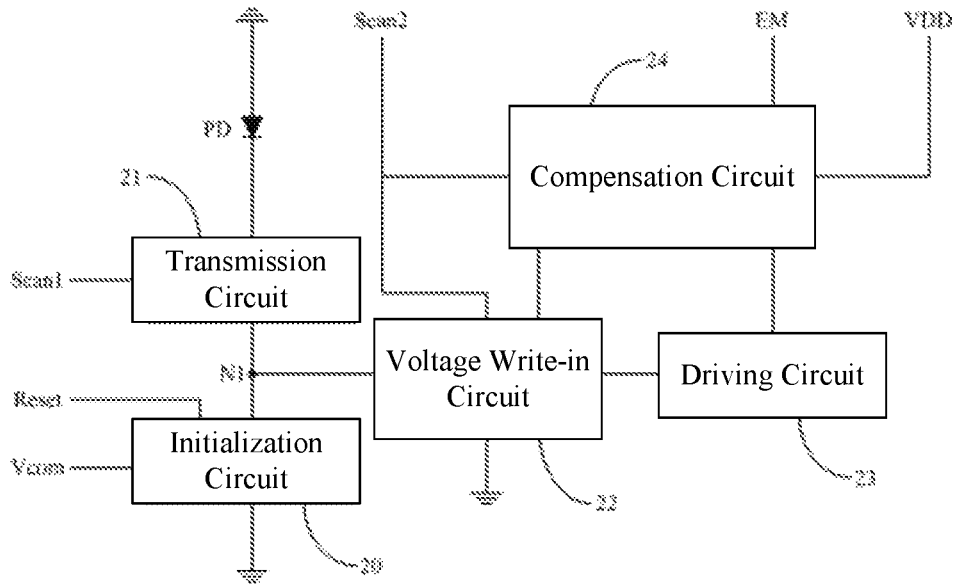
FIG. 2 is a schematic diagram of a structure of circuits of a pixel circuit provided by an embodiment of the present disclosure.

As shown in FIG. 2, an embodiment of the present disclosure provides a pixel circuit, comprising: a photodiode PD, a driving circuit 23, an initialization circuit 20, a transmission circuit 21, a voltage write-in circuit 22 and a compensation circuit 24;

one end of the photodiode PD is electrically connected to a grounding end, and the other end is electrically connected to the transmission circuit 21;

the initialization circuit 20 is electrically connected to an initialization signal end (corresponding to an initialization signal Reset of the pixel circuit) and an initialization voltage end (corresponding to an initialization voltage Vcom of the pixel circuit), and configured to pull a voltage of a first node N1 to the initialization voltage Vcom input by the initialization voltage end under control of the initialization signal end;

the transmission circuit 21 is electrically connected to the initialization circuit 20 and a first scanning signal end (corresponding to a first scanning signal Scan1 of the pixel circuit), and configured to pull down the voltage of the first node N1 from the initialization voltage to a data voltage under control of the first scanning signal end; a value of the data voltage is decreased along with the increase of an illumination intensity received by the photodiode PD;

the voltage write-in circuit 22 is electrically connected to the first node N1, the driving circuit 23, the compensation circuit 24, the grounding end and a second scanning signal end (corresponding to a second scanning signal Scan2 of the pixel circuit), and configured to write the data voltage into the driving circuit 23 under control of the second scanning signal end and output a grounding voltage to the compensation circuit 24;

the compensation circuit 24 is electrically connected to the driving circuit 23, a high voltage-level signal end (corresponding to a high voltage-level signal VDD), a compensation signal end (corresponding to a compensation signal EM of the pixel circuit) and the second scanning signal end (corresponding to the second scanning signal Scan2 of the pixel circuit), and configured to perform threshold voltage compensation on the driving circuit 23 under control of the compensation signal end and the second scanning signal end;

where the first node N1 is an intersection point among the initialization circuit 20, the transmission circuit 21 and the voltage write-in circuit 22. For example, the first node N1 is an intersection point where the initialization circuit 20, the transmission circuit 21 and the voltage write-in circuit 22 are electrically connected to each other.

Figure 3:
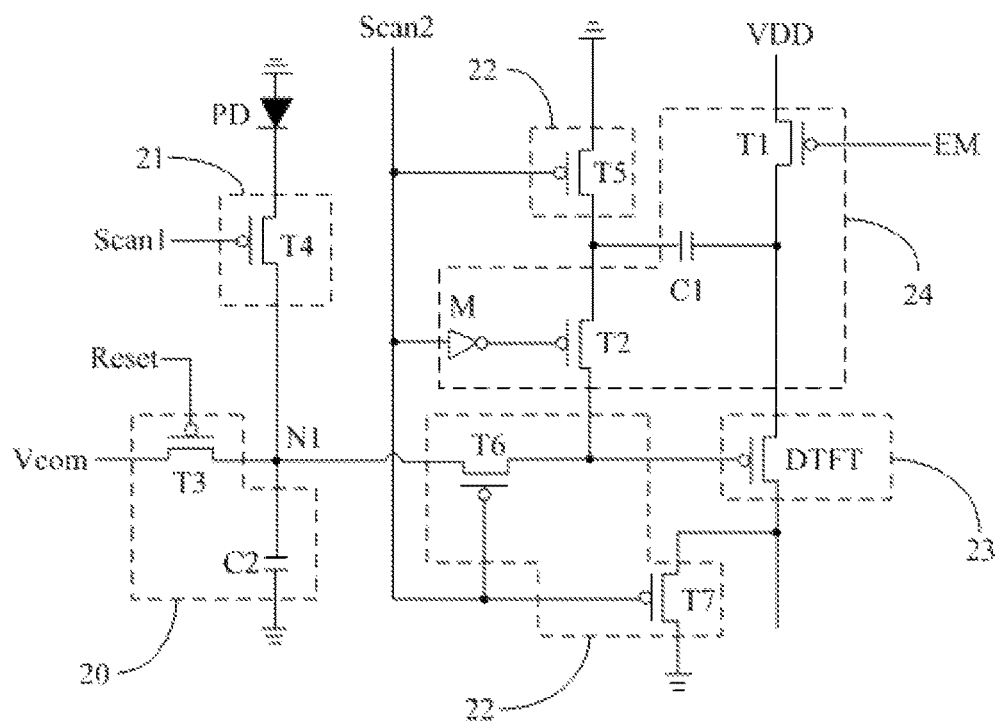
FIG. 3 is a schematic diagram of a specific circuit structure of a pixel circuit provided by an embodiment of the present disclosure.

For example, as shown in FIG. 3, the driving circuit 23 in an embodiment of the present disclosure includes a driving transistor DTFT. A gate electrode of the driving transistor DTFT is electrically connected to the compensation circuit 24 and the voltage write-in circuit 22, a source electrode is electrically connected to the compensation circuit 24 and a drain electrode is electrically connected to the voltage write-in circuit 22 and an output signal line 10.

For example, the driving transistor in a specific embodiment of the present disclosure is a P type thin film transistor.

For example, as shown in FIG. 3, the compensation circuit 24 in a specific embodiment of the present disclosure includes a first capacitor C1, a first switching transistor T1, an inverter M and a second switching transistor T2;

one end of the first capacitor C1 is electrically connected to the voltage write-in circuit 22, and the other end is electrically connected to the driving circuit 23;

a gate electrode of the first switching transistor T1 is electrically connected to the compensation signal end (corresponding to a compensation signal EM of the pixel circuit), and the other two electrodes are respectively and electrically connected to the high voltage-level signal end (corresponding to the high voltage-level signal VDD) and the driving circuit 23;

one end of the inverter M is electrically connected to the second scanning signal end (corresponding to the second scanning signal Scan2 of the pixel circuit), and the other end is electrically connected to a gate electrode of the second switching transistor T2; and the other two electrodes of the second switching transistor T2 are respectively and electrically connected to the voltage write-in circuit 22 and the driving circuit 23.

For example, as shown in FIG. 3, the initialization circuit 20 in a specific embodiment of the present disclosure includes a third switching transistor T3 and a second capacitor C2;

one end of the second capacitor C2 is electrically connected to the first node N1, and the other end is electrically connected to the grounding end; and a gate electrode of the third switching transistor T3 is electrically connected to the initialization signal end (corresponding to the initialization signal Reset of the pixel circuit), and the other two electrodes are respectively and electrically connected to the initialization voltage end (corresponding to the initialization voltage Vcom of the pixel circuit) and the first node N1.

For example, as shown in FIG. 3, the transmission circuit 21 in a specific embodiment of the present disclosure includes a fourth switching transistor T4, a gate electrode of the fourth switching transistor T4 is electrically connected to the first scanning signal end (corresponding to the first scanning signal Scan1 of the pixel circuit) and the other two electrodes are respectively and electrically connected to the photodiode PD and the first node N1.

For example, as shown in FIG. 3, the voltage write-in circuit 22 in a specific embodiment of the present disclosure includes a fifth switching transistor T5, a sixth switching transistor T6 and a seventh switching transistor T7;

a gate electrode of the fifth switching transistor T5 is electrically connected to the second scanning signal end (corresponding to the second scanning signal Scan2 of the pixel circuit) and the other two electrodes are respectively and electrically connected to the grounding end and the compensation circuit 24;

a gate electrode of the sixth switching transistor T6 is electrically connected to the second scanning signal end (corresponding to the second scanning signal Scan2 of the pixel circuit) and the other two electrodes are respectively and electrically connected to the first node N1 and the driving circuit 23; and a gate electrode of the seventh switching transistor T7 is electrically connected to the second scanning signal end (corresponding to the second scanning signal Scan2 of the pixel circuit) and the other two electrodes are respectively and electrically connected to the grounding end and the driving circuit 23.

For example, the first switching transistor T1, the second switching transistor T2, the third switching transistor T3, the fourth switching transistor T4, the fifth switching transistor T5, the sixth switching transistor T6 and the seventh switching transistor T7 in embodiments of the present disclosure are all P type thin film transistors. When gate electrodes of the P type thin film transistors are loaded with a low voltage, the P type thin film transistors are turned on. Of course, during an actual circuit design, the switching transistors in the embodiments of the present disclosure can also adopt N type thin film transistors, or a manner of a mixed design of the P type thin film transistors and the N type thin film transistors.

In specific implementations, the functions of source electrodes and drain electrodes of the first switching transistor T1, the second switching transistor T2, the third switching transistor T3, the fourth switching transistor T4, the fifth switching transistor T5, the sixth switching transistor T6 and the seventh switching transistor T7 can be exchanged according to different types of the switching transistors and different signals of signal ends, and are not specifically differentiated herein.

A specific working principle of the pixel circuit provided by embodiments of the present disclosure is explained specifically in combination with FIGS. 3 to 9.

Figure 4:
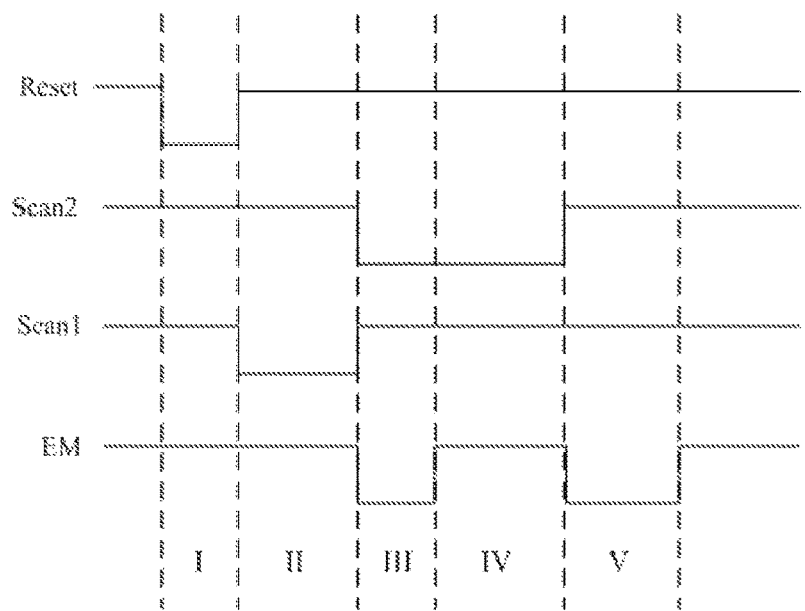
FIG. 4 is a timing sequence diagram of the pixel circuit as shown in FIG. 3.

As shown in FIGS. 3 and 4, at a stage I, the initialization signal Reset is at a low voltage level, and the first scanning signal Scan1, the second scanning signal Scan2 and the compensation signal EM are all at a high voltage level; at this time, in FIG. 3, the third switching transistor T3 is turned on; the first switching transistor T1, the fourth switching transistor T4, the fifth switching transistor T5, the sixth switching transistor T6 and the seventh switching transistor T7 are all turned off; in addition, the second switching transistor T2 is connected to the inverter M, a signal loaded to a gate electrode of the second switching transistor T2 is at the low voltage level, and therefore, the second switching transistor T2 is also in a turning-on state.

Figure 5:
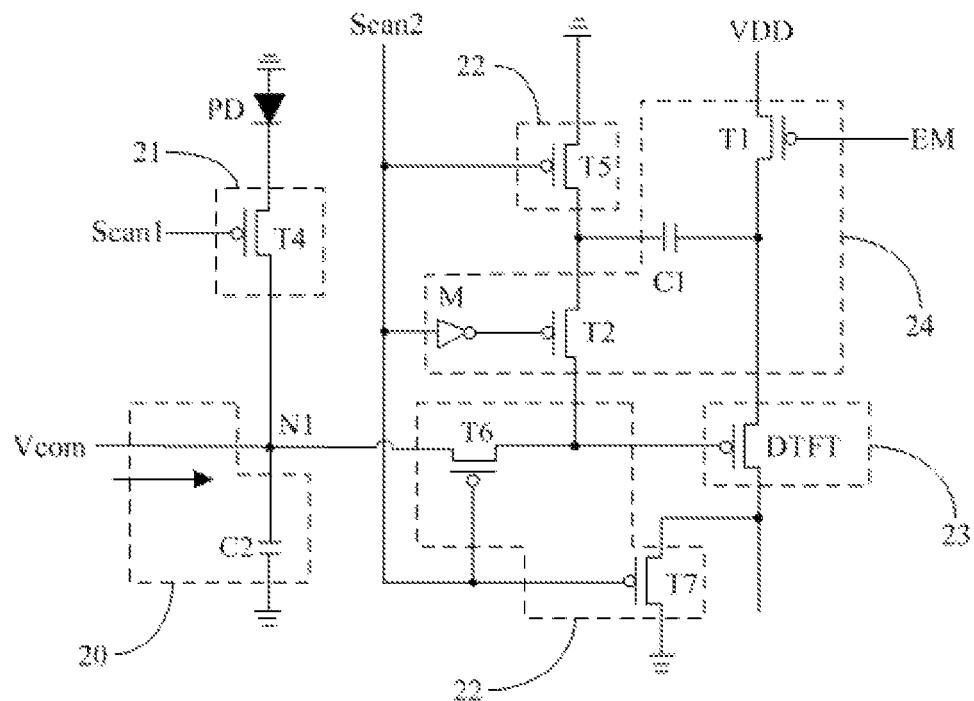
FIGS. 5 to 9 are circuit schematic diagrams of working principles when a pixel circuit is at different working stages provided by an embodiment of the present disclosure.

A simplified circuit diagram of FIG. 3 at the stage I is as shown in FIG. 5. The third switching transistor T3 in the turning-on state in the figure is replaced with a conducted straight line, a generated current direction is as shown by an arrow direction in the figure; at this point, a voltage of the first node N1 is pulled to the initialization voltage Vcom input by the initialization voltage end. For example, a value of the initialization voltage Vcom can be set according to actual circuit needs, and the pixel circuit in a specific embodiment of the present disclosure aims to reset previous voltage signals at the stage I.

As shown in FIGS. 3 and 4, at a stage II, the first scanning signal Scan1 is at a low voltage level, and the initialization signal Reset, the second scanning signal Scan2 and the compensation signal EM are all at a high voltage level; at this point, in FIG. 3, the fourth switching transistor T4 is turned on; the first switching transistor T1, the third switching transistor T3, the fifth switching transistor T5, the sixth switching transistor T6 and the seventh switching transistor T7 are all turned off; in addition, the second switching transistor T2 is connected to the inverter M, and therefore, the second switching transistor T2 is in a turning-on state.

Figure 6:
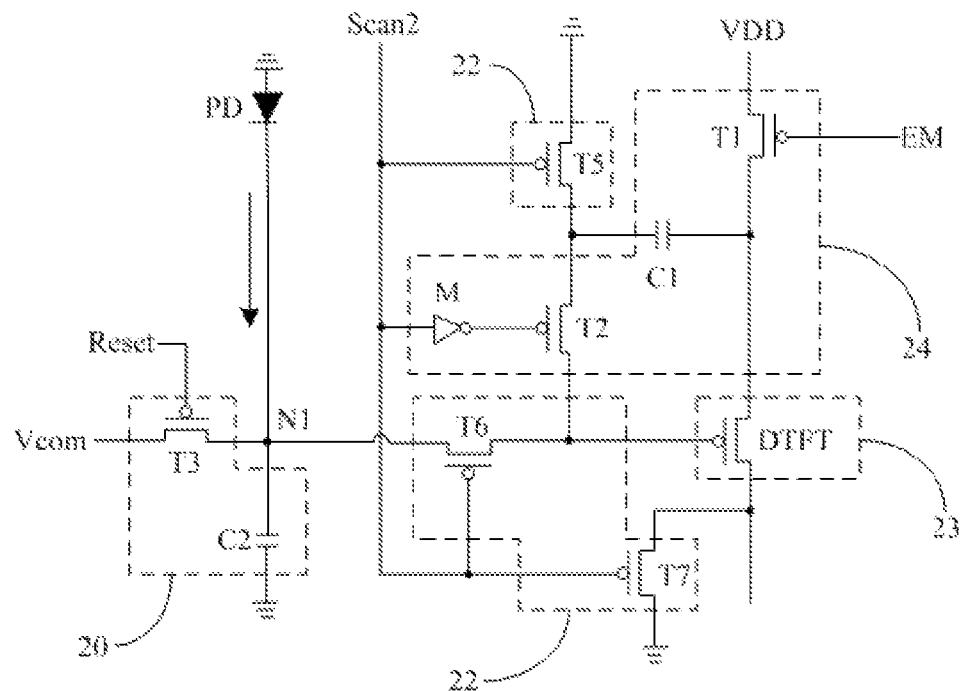

A simplified circuit diagram of FIG. 3 at the stage II is as shown in FIG. 6. The fourth switching transistor T4 in the turning-on state in the figure is replaced with a conducted straight line, and a generated current direction is as shown by an arrow direction in the figure. When incident light illuminates on a PN junction of the photodiode PD, light quantum excitation generates electron-hole pairs on the PN junction, such that charges on a PN junction capacitor are recombined, causing a voltage of the first node N1 to be reduced. Specifically, the voltage of the first node N1 is reduced to a data voltage Vdata from the initialization voltage Vcom, and is stored on the first node N1 on one end of the second capacitor C2. In a specific embodiment of the present disclosure, a value of the data voltage Vdata stored on the first node N1 on one end of the second capacitor C2 is decreased along with the increase of an illumination intensity received by the photodiode PD.

As shown in FIGS. 3 and 4, at a stage III, the second scanning signal Scan2 and the compensation signal EM are at a low voltage level, and the first scanning signal Scan1 and the initialization signal Reset are at a high voltage level; at this point, in FIG. 3, the first switching transistor T1, the fifth switching transistor T5, the sixth switching transistor T6 and the seventh switching transistor T7 in FIG. 3 are all turned on; the third switching transistor T3 and the fourth switching transistor T4 are turned off; in addition, the second switching transistor T2 is connected to the inverter M, and therefore, the second switching transistor T2 is turned off.

Figure 7:
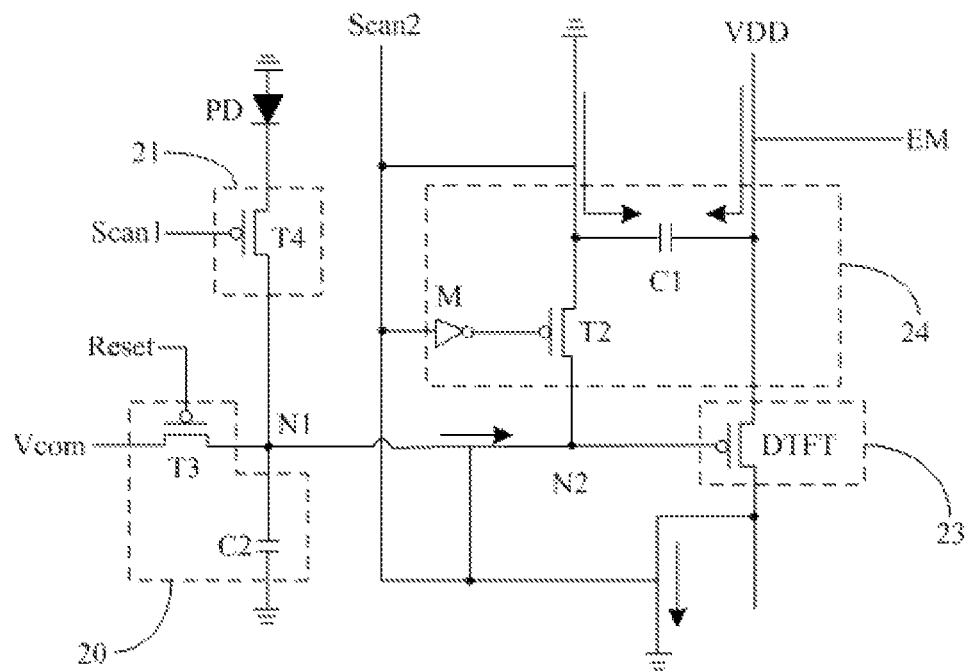

A simplified circuit diagram of FIG. 3 at the stage III is as shown in FIG. 7. In the figure, the first switching transistor T1, the fifth switching transistor T5, the sixth switching transistor T6 and the seventh switching transistor T7 which are in the turning-on state are replaced with conducted straight lines, and generated current directions are as shown by arrow directions in the diagram; at this time, the data voltage Vdata is written into the driving circuit 23, that is, the voltage of a second node N2 in a specific embodiment of the present disclosure is the data voltage Vdata. In addition, one end of the first capacitor C1 in a specific embodiment of the present disclosure is grounded, the voltage for example is 0V, the other end is connected to the high voltage-level signal end (corresponding to the high voltage-level signal VDD), and the voltage is a high voltage-level voltage Vdd.

As shown in FIGS. 3 and 4, at a stage IV, the second scanning signal Scan2 is at a low voltage level, and the initialization signal Reset, the first scanning signal Scan1 and the compensation signal EM are all at a high voltage level; at this point, in FIG. 3, the fifth switching transistor T5, the sixth switching transistor T6 and the seventh switching transistor T7 are all turned on; the first switching transistor T1, the third switching transistor T3 and the fourth switching transistor T4 are all turned off; in addition, the second switching transistor T2 is connected to the inverter M, and therefore, the second switching transistor T2 is turned off.

Figure 8:
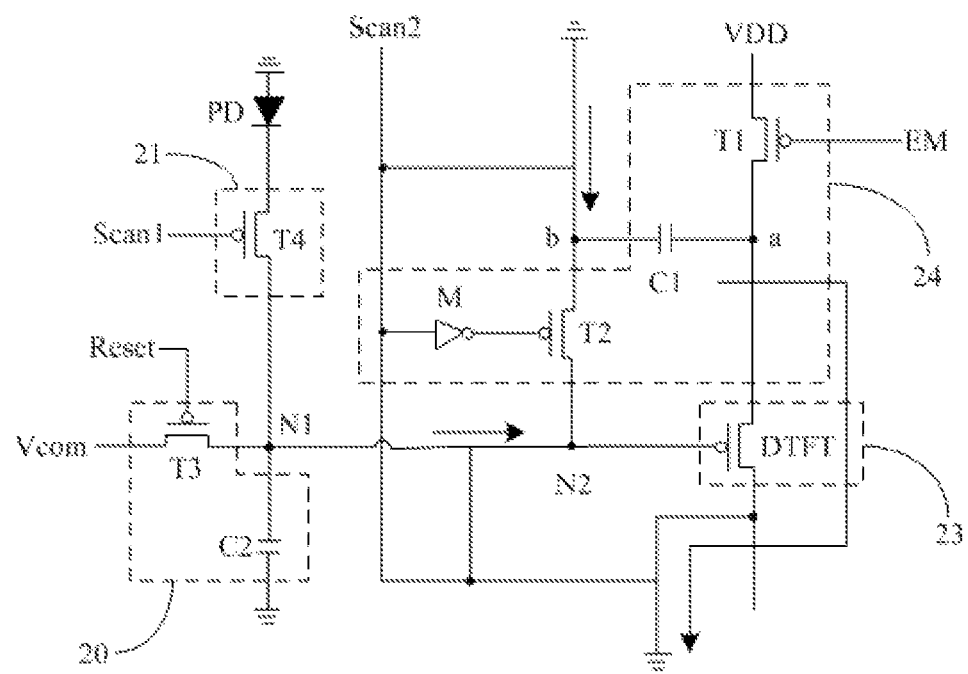

A simplified circuit diagram of FIG. 3 at the stage IV is as shown in FIG. 8. In the figure, the fifth switching transistor T5, the sixth switching transistor T6 and the seventh switching transistor T7 which are in the turning-on state are replaced with conducted straight lines, and generated current directions are as shown by arrow directions in the figure. At this time, the first capacitor C1 discharges, and since the voltage of the second node N2 is Vdata, the voltage of an end a after the first capacitor C1 discharges is Vdata+Vth, where Vth is a threshold voltage of the driving transistor DTFT. Since an end b of the first capacitor C1 is grounded, a voltage of the end b is 0V, and at this point, a voltage difference between the two ends of the first capacitor C1 is Vdata+Vth.

As shown in FIGS. 3 and 4, at a stage V, the compensation signal EM is at a low voltage level; the initialization signal Reset, the first scanning signal Scan1 and the second scanning signal Scan2 are all at a high voltage level; at this point, in FIG. 3, the first switching transistor T1 is turned on; the third switching transistor T3, the fourth switching transistor T4, the fifth switching transistor T5, the sixth switching transistor T6 and the seventh switching transistor T7 are all turned off; in addition, the second switching transistor T2 is connected to the inverter M, and therefore, the second switching transistor T2 is turned on.

Figure 9:
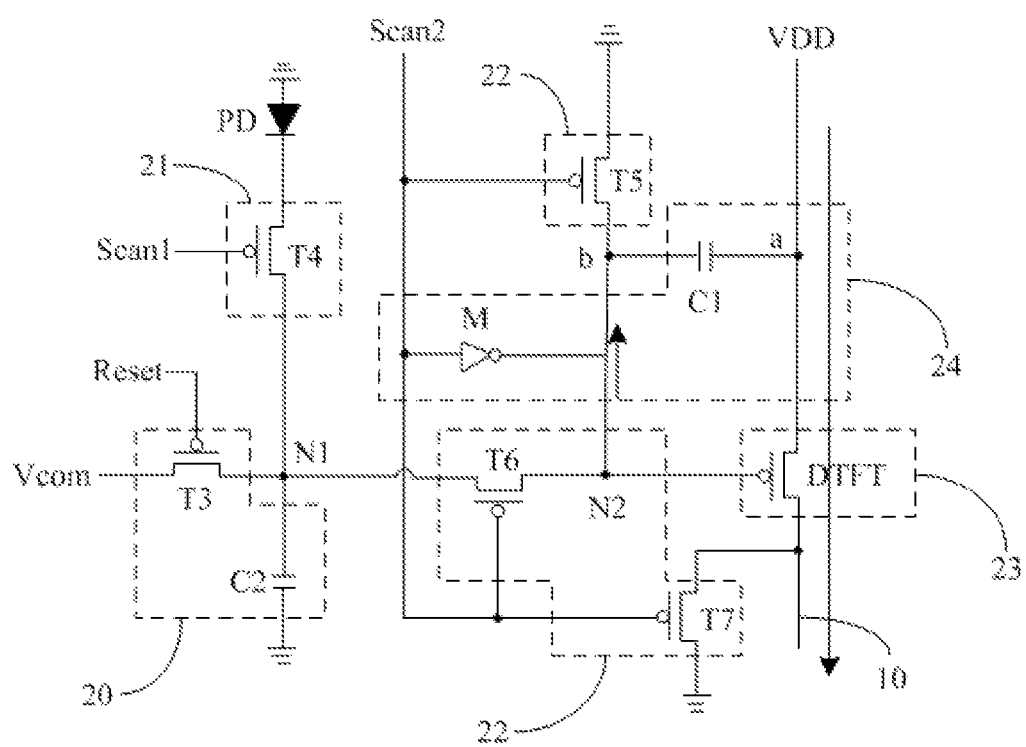

A simplified circuit diagram of FIG. 3 at the stage V is as shown in FIG. 9. In the figure, the first switching transistor T1 in the turning-on state is replaced with a conducted straight line, and a generated current direction is as shown by an arrow direction in the figure. At this time, the end a of the first capacitor C1 is connected to the high voltage-level signal end (corresponding to the high voltage-level signal VDD), and the voltage is the high voltage level-voltage Vdd; the end b of the first capacitor C1 is connected in a floating manner, and since the first capacitor C1 needs to keep the previous voltage difference, an equal voltage jump occurs, and since the voltage difference between the two ends of the first capacitor C1 at the stage IV is Vdata+Vth, the voltage of the end b of the first capacitor C1 after the jump is changed into Vdd-Vdata-Vth, that is, the voltage of the second node N2 is Vdd-Vdata-Vth.

As shown in FIG. 9, according to a saturation current formula, a current output to the output signal line 10 is:

$$I=K(V_{GS}-Vth)^2=K[Vdd-(Vdd-Vdata-Vth)-Vth]^2=K*Vdata^2$$

where K is a preset coefficient, and $V_{GS}$ is a gate-source voltage difference of the driving transistor DTFT.

It can be seen from the formula above that at this point, a working current I is not affected by the threshold voltage Vth of the driving transistor DTF, while the Vdata is generated by illumination of the photodiode, and the problem of drift of the threshold voltage caused by technological manufacture procedures and long time operation of the driving transistor is solved. Thus, a compensation effect is achieved, thereby well ensuring the accuracy of signal data.

A specific embodiment of the present disclosure further provides a semiconductor camera detection circuit, which comprises the pixel circuit above provided by embodiments of the present disclosure. For example, the semiconductor camera detection circuit in a specific embodiment of the present disclosure is a CMOS camera detection circuit.

A specific embodiment of the present disclosure also provides a display device, comprising the semiconductor camera detection circuit above provided by embodiments of the present disclosure. The display device can be a display device, such as a liquid crystal panel, a liquid crystal display, a liquid crystal television, an Organic Light Emitting Diode (OLED) panel, an OLED display, an OLED television or electronic paper, etc.

In conclusion, embodiments of the present disclosure provide a pixel circuit, comprising a photodiode, a driving circuit, an initialization circuit, a transmission circuit, a voltage write-in circuit and a compensation circuit; one end of the photodiode is electrically connected to a grounding end, and another end is electrically connected to the transmission circuit; the initialization circuit is electrically connected to an initialization signal end and an initialization voltage end, and configured to pull a voltage of a first node to an initialization voltage input by the initialization voltage end under control of the initialization signal end; the transmission circuit is electrically connected to the initialization circuit and a first scanning signal end, and configured to pull down the voltage of the first node from the initialization voltage to a data voltage under control of the first scanning signal end, where a value of the data voltage is decreased along with the increase of an illumination intensity received by the photodiode; the voltage write-in circuit is electrically connected to the first node, the driving circuit, the compensation circuit, the grounding end and a second scanning signal end, and configured to write the data voltage into the driving circuit under control of the second scanning signal end and output a grounding voltage to the compensation circuit; the compensation circuit is electrically connected to the driving circuit, a high voltage-level signal end, a compensation signal end and the second scanning signal end, and configured to perform threshold voltage compensation on the driving circuit under control of the compensation signal end and the second scanning signal end; where the first node is a point of intersection among the initialization circuit, the transmission circuit and the voltage write-in circuit. In a specific embodiment of the present disclosure, the transmission circuit is configured to pull down the voltage of the first node from the initialization voltage to a data voltage under control of the first scanning signal end, where a value of the data voltage is decreased along with the increase of an illumination intensity received by the photodiode; the voltage write-in circuit is configured to write the data voltage into the driving circuit under control of the second scanning signal end; and the compensation circuit is configured to perform threshold voltage compensation on the driving circuit under control of the compensation signal end and the second scanning signal end. Therefore, according to embodiments of the present disclosure, the data voltage written into the driving circuit is merely related to an illumination intensity received by the photodiode while the compensation circuit performs threshold voltage compensation on the driving circuit, and the problem in existing technologies that there exists a difference between the size of an output current and the size of a current actually generated by illumination due to the drift of the threshold voltage of the driving transistor is solved.

In the present disclosure, terms such as "first", "second" and the like used in the present disclosure do not indicate any sequence, quantity or significance but only for distinguishing different constituent parts. Also, the terms such as "a," "an," or "the" etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects.

Obviously, those skilled in the art may modify the disclosure in various ways without breaking away from the spirits and scope of the disclosure. And so, if these changes and variations of the disclosure also fall within the scope of the claims or their equivalent technologies, the disclosure intends to include these changes and variations.

What are described above is related to the illustrative embodiments of the disclosure only and not limitative to the scope of the disclosure; any changes or replacements easily for those technical personnel who are familiar with this technology in the field to envisage in the scopes of the disclosure, should be in the scope of protection of the present disclosure. Therefore, the scopes of the disclosure are defined by the accompanying claims.

The present application claims the priority of the Chinese Patent Application No. 201610506759.6 filed on Jun. 30, 2016, which is incorporated herein by reference in its entirety as part of the disclosure of the present application.

The invention claimed is:

1. A pixel circuit, comprising: a photodiode, a driving circuit, an initialization circuit, a transmission circuit, a voltage write-in circuit and a compensation circuit, wherein:
   one end of the photodiode is electrically connected to a grounding end, and another end of the photodiode is electrically connected to the transmission circuit;
   the initialization circuit is electrically connected to an initialization signal end and an initialization voltage end, and configured to pull a voltage of a first node to an initialization voltage input by the initialization voltage end under control of the initialization signal end;
   the transmission circuit is electrically connected to the initialization circuit and a first scanning signal end, and configured to pull down the voltage of the first node from the initialization voltage to a data voltage under control of the first scanning signal end, wherein a value of the data voltage is decreased along with an increase of an illumination intensity received by the photodiode;
   the voltage write-in circuit is electrically connected to the first node, the driving circuit, the compensation circuit, the grounding end and a second scanning signal end, and configured to write the data voltage into the driving circuit under control of the second scanning signal end and output a grounding voltage to the compensation circuit;
   the compensation circuit is electrically connected to the driving circuit, a high voltage-level signal end, a compensation signal end and the second scanning signal end, and configured to perform threshold voltage compensation on the driving circuit under control of the compensation signal end and the second scanning signal end; and
   the first node is an intersection point among the initialization circuit, the transmission circuit and the voltage write-in circuit.

2. The pixel circuit according to claim 1, wherein the compensation circuit includes a first capacitor, a first switching transistor, a second switching transistor and an inverter;
   one end of the first capacitor is electrically connected to the voltage write-in circuit, and another end of the first capacitor is electrically connected to the driving circuit;
   a gate electrode of the first switching transistor is electrically connected to the compensation signal end, and two other electrodes of the first switching transistor are electrically connected to the high voltage-level signal end and the driving circuit respectively;
   one end of the inverter s electrically connected to the second scanning signal end, and another end of the inverter is electrically connected to a gate electrode of the second witching transistor; and
   two other electrodes of the second switching transistor are electrically connected to the voltage write-in circuit and the driving circuit, respectively.

3. The pixel circuit according to claim 2, wherein the firsts switching transistor, and the second switching transistor are P type or N type thin film transistors.

4. The pixel circuit according to claim 1, wherein the initialization circuit includes a third switching transistor and a second capacitor;
   one end of the second capacitor is electrically connected to the first node, and another end of the second capacitor is electrically connected to the grounding end; and
   a gate electrode of the third switching transistor is electrically connected to the initialization signal end, and two other electrodes of the third switching transistor are electrically connected to the initialization voltage end and the first node, respectively.

5. The pixel circuit according to claim 4, wherein the third switching transistor is a P type or N type thin film transistor.

6. The pixel circuit according to claim 1, wherein the transmission circuit includes a fourth switching transistor, a gate electrode of the fourth switching transistor is electrically connected to the first scanning signal end and two other electrodes of the fourth switching transistor are electrically connected to the photodiode and the first node, respectively.

7. The pixel circuit according to claim 6, wherein the fourth switching transistor is a P type or N type thin film transistor.

8. The pixel circuit according a aim 1, wherein the voltage write-in circuit includes a fifth switching transistor, a sixth switching transistor and a seventh switching transistor;
   a gate electrode of the fifth switching, transistor is electrically connected to the second scanning signal end and two other electrodes of the fifth switching transistor are electrically connected to the grounding end and the compensation circuit, respectively;
   a gate electrode of the sixth switching transistor is electrically connected to the second scanning signal end and two other electrodes of the sixth switching transistor are electrically connected to the first node and the driving circuit, respectively; and
   a gate electrode of the seventh switching transistor is electrically connected to the second scanning signal end and two other electrodes of the seventh switching transistor are electrically connected to the grounding end and the driving circuit, respectively.

9. The pixel circuit according to claim 8 wherein the fifth switching transistor, the sixth switching transistor and the seventh switching transistor are P type or N type thin film transistors.

10. The pixel circuit according to claim 1, wherein the driving circuit includes a driving transistor, a gate electrode of the driving transistor is electrically connected to the compensation circuit and the voltage write-in circuit, a source electrode of the driving transistor is electrically connected to the compensation circuit and a drain electrode of the driving transistor is electrically connected to the voltage write-in circuit and an output signal line.

11. The pixel circuit according to claim 10, wherein the driving transistor is a P type thin film transistor.

12. A semiconductor camera detection circuit, comprising the pixel circuit according to claim 1.

13. A display device, comprising the semiconductor camera detection circuit according to claim 12.

14. The semiconductor camera detection circuit according claim 12, wherein the compensation circuit includes a first capacitor, a first switching transistor, a second switching transistor and an inverter;
   one end of the first capacitor is electrically connected to the voltage write-in circuit, and another end of the first capacitor is electrically connected to the driving circuit;
   a gate electrode of the first switching transistor electrically connected to the compensation signal end, and, two other electrodes of the first switching transistor are electrically connected to the high voltage-level signal end and the driving circuit, respectively;
   one end of the inverter is electrically connected to the second scanning signal end, and another end of the inverter is electrically connected to a gate electrode of the second switching transistor; and
   two other electrodes of the second switching transistor are electrically connected to the voltage write-in circuit and the driving circuit, respectively.

15. The semiconductor camera detection circuit according to claim 12, wherein the initialization circuit includes a third switching transistor and a second capacitor;
   one end of the second capacitor is electrically connected to the first node, and another end of the second capacitor is electrically connected to the grounding end; and
   a gate electrode of the third switching transistor is electrically connected to the initialization signal end, and two other electrodes of the third switching transistor are electrically connected to the initialization voltage end and the first node, respectively.

16. The semiconductor camera detection circuit according to claim 12, wherein the transmission circuit includes a fourth switching transistor, a gate electrode of the fourth switching transistor is electrically connected to the first scanning signal end and two other electrodes of the fourth switching transistor are electrically connected to the photodiode and the first node, respectively.

17. The semiconductor camera, detection circuit according to claim 12, wherein the voltage write-in circuit includes a fifth switching transistor, a sixth switching transistor and a seventh switching transistor;
   a gate electrode of the fifth switching transistor is electrically connected to the second scanning signal end and two other electrodes of the fifth switching transistor are electrically connected to the grounding end and the compensation circuit, respectively;
   a gate electrode of the sixth switching transistor electrically connected to the second scanning signal end and two other electrodes of the sixth switching transistor electrically connected to the first node and the driving circuit, respectively; and
   a gate electrode of the seventh switching transistor is electrically connected to the second scanning signal end and two other electrodes of the seventh switching transistor are electrically connected to the grounding end and the driving circuit, respectively.

* * * * *